US008426829B2

(12) United States Patent
Leavitt et al.

(10) Patent No.: US 8,426,829 B2
(45) Date of Patent: Apr. 23, 2013

(54) ION IMPLANTATION APPARATUS

(75) Inventors: William H Leavitt, Haverhill, MA (US); Theodore H Smick, Essex, MA (US); Joseph Daniel Gillespie, Boston, MA (US); William H Park, Somerville, MA (US); Paul Eide, Stratham, NH (US); Drew Arnold, Salem, MA (US); Geoffrey Ryding, Manchester, MA (US)

(73) Assignee: GTAT Corporation, Nashua, NH (US)

( * ) Notice: Subject to any disclaimer, the term of this patent is extended or adjusted under 35 U.S.C. 154(b) by 226 days.

(21) Appl. No.: 12/894,229

(22) Filed: Sep. 30, 2010

(65) Prior Publication Data
US 2011/0073781 A1 Mar. 31, 2011

Related U.S. Application Data

(63) Continuation-in-part of application No. 12/568,923, filed on Sep. 29, 2009.

(51) Int. Cl.
*H01J 37/317* (2006.01)

(52) U.S. Cl.
USPC .................................. 250/442.11; 250/443.1

(58) Field of Classification Search ............. 250/492.21, 250/442.11, 443.1
See application file for complete search history.

(56) References Cited

U.S. PATENT DOCUMENTS

| | | | |
|---|---|---|---|
| 4,733,091 A * | 3/1988 | Robinson et al. ......... 250/492.2 |
| 4,831,270 A | 5/1989 | Weisenberger | |
| 5,057,908 A | 10/1991 | Weber | |
| 5,244,820 A | 9/1993 | Kamata et al. | |
| 5,350,427 A | 9/1994 | Freytsis et al. | |
| 5,350,926 A | 9/1994 | White et al. | |
| 5,389,793 A | 2/1995 | Aitken et al. | |
| 5,834,786 A | 11/1998 | White et al. | |
| 6,677,594 B1 | 1/2004 | Young | |
| 6,770,888 B1 | 8/2004 | Benveniste et al. | |
| 2009/0283669 A1 | 11/2009 | Parrill et al. | |

FOREIGN PATENT DOCUMENTS

WO 2004114356 12/2004

OTHER PUBLICATIONS

Office Action dated Apr. 13, 2012 for U.S. Appl. No. 12/568,923.
U.S. Appl. No. 12/494,268, filed Jun. 30, 2009, entitled "Ion Implantation Apparatus and Method for Fluid Cooling".
U.S. Appl. No. 12/494,269, filed Jun. 30, 2009, entitled "Ion Implantation Apparatus".
U.S. Appl. No. 12/494,270, filed Jun. 30, 2009, entitled "Ion Implantation Apparatus and Method".

(Continued)

*Primary Examiner* — Kiet T Nguyen
(74) *Attorney, Agent, or Firm* — The Mueller Law Office, P.C.

(57) ABSTRACT

An ion implanter has an implant wheel with a plurality of wafer carriers distributed about a periphery of the wheel. Each wafer carrier has a heat sink for removing heat from a wafer on the carrier during the implant process by thermal contact between the wafer and the heat sink. The wafer carriers have wafer retaining fences formed as cylindrical rollers with axes in the respective wafer support planes of the wafer carriers. The cylindrical surfaces of the rollers provide wafer abutment surfaces which can move transversely to the wafer support surfaces so that no transverse loading is applied by the fences to wafer edges as the wafer is pushed against the heat sink by centrifugal force. The wafer support surfaces comprise layers of elastomeric material and the movable abutment surfaces of the fences allow even thermal coupling with the heat sink over the whole area of the wafer.

5 Claims, 11 Drawing Sheets

OTHER PUBLICATIONS

U.S. Appl. No. 12/494,272, filed Jun. 30, 2009, entitled "ion Source Assembly for Ion Implantation Apparatus and Method of Generating Ions Therein".

* cited by examiner

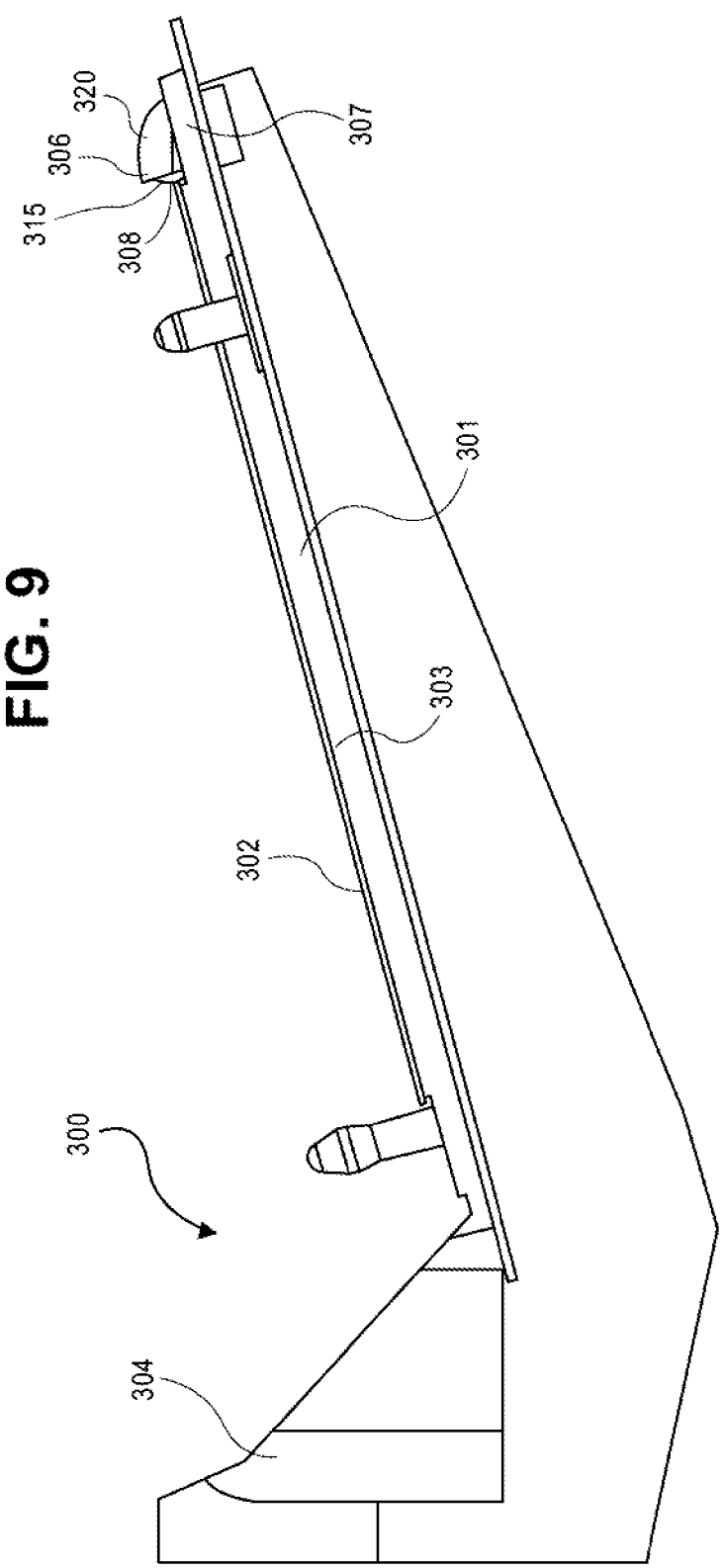

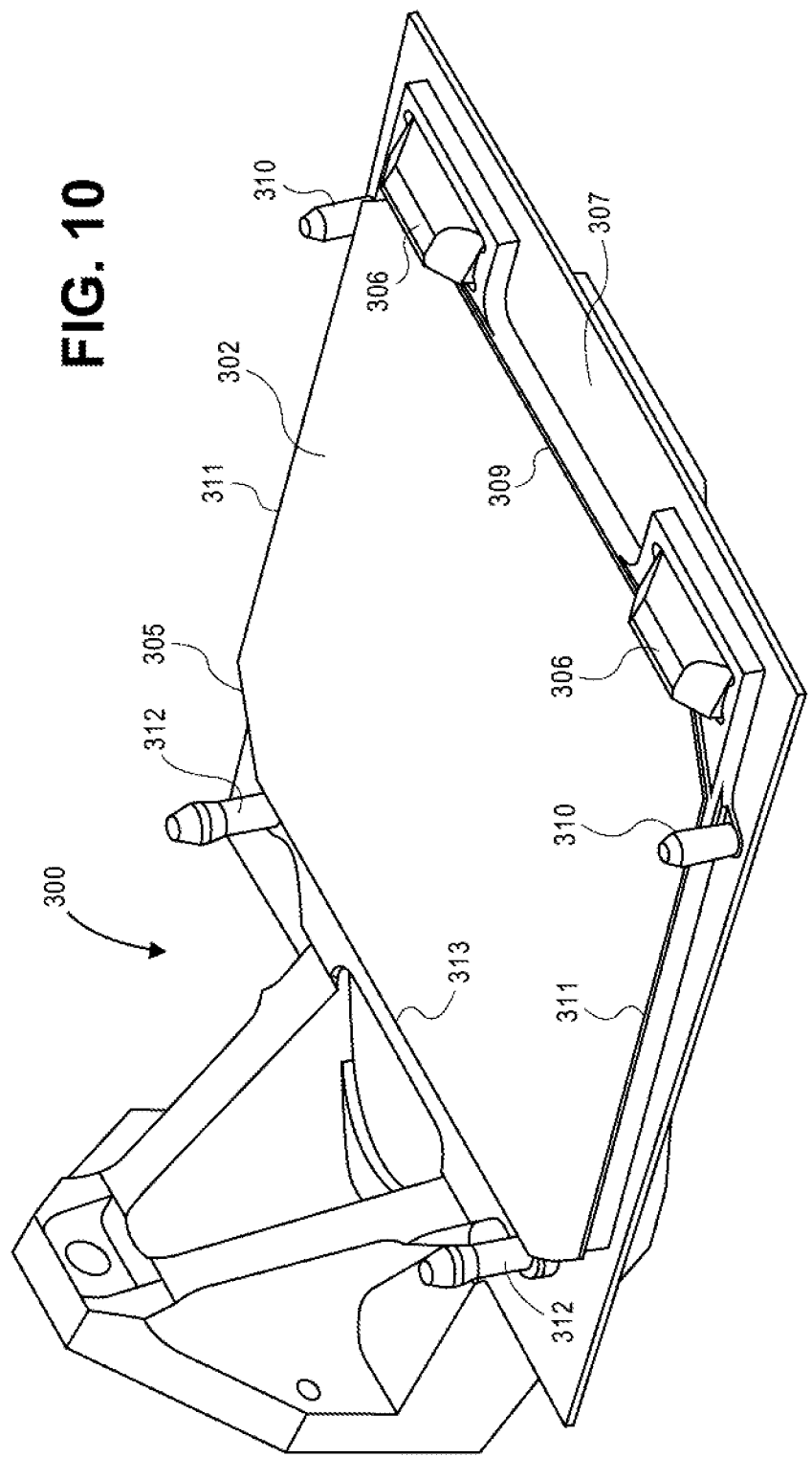

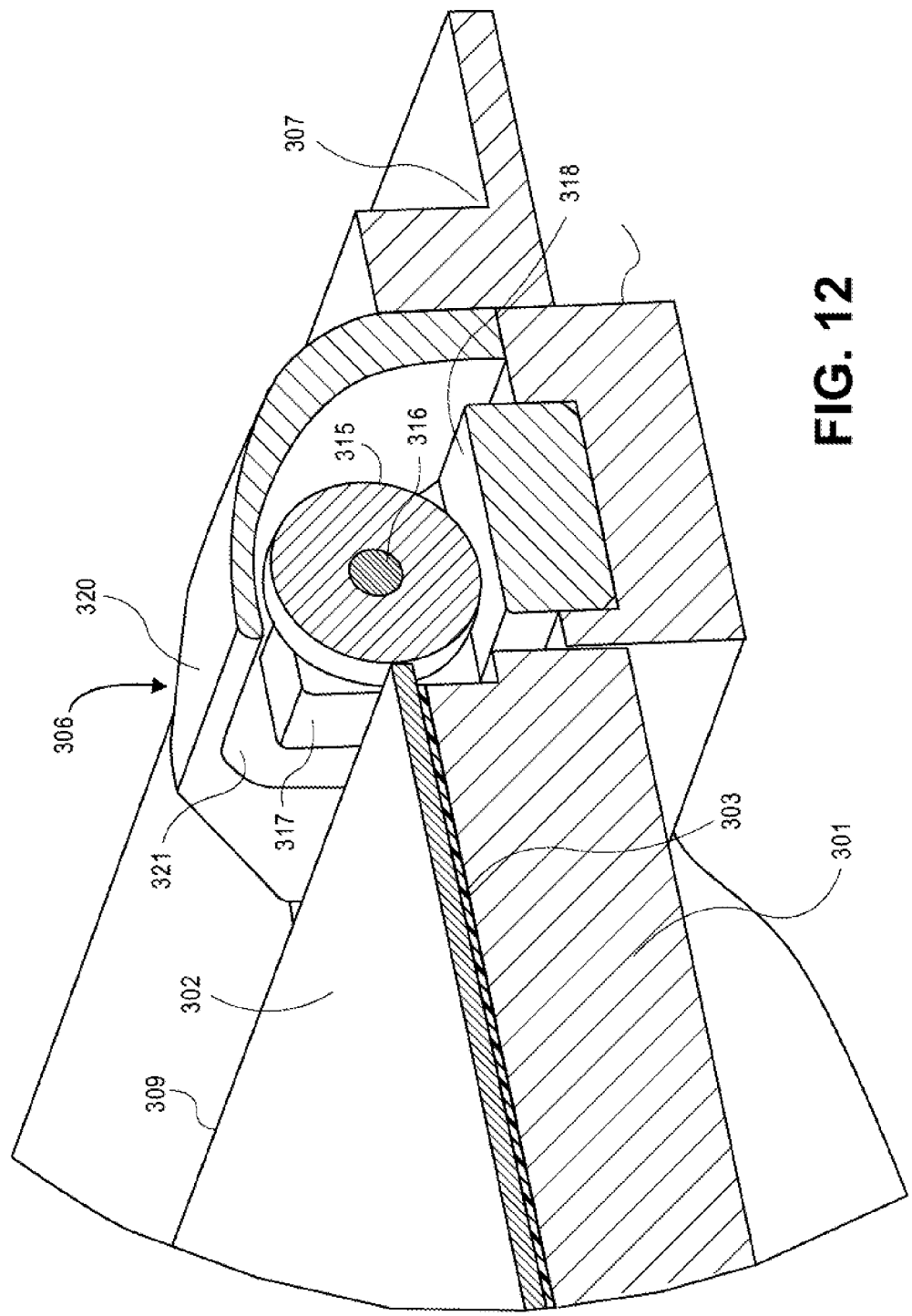

ION IMPLANTATION APPARATUS

RELATED PATENT APPLICATION

This patent application is a continuation-in-part of Smick et al., U.S. patent application Ser. No. 12/568,923, "Ion Implantation Apparatus," filed Jun. 29, 2009 owned by the assignee of the present application and hereby incorporated by reference.

BACKGROUND

1. Field of the Invention

This invention relates to a method of implanting ions into a substrate wafer and an ion implantation apparatus for implanting ions into a substrate wafer. Example applications of the ion implantation method and apparatus include the separation or exfoliation of thin layers of crystalline semiconductor material, such as silicon, in the production of photovoltaic cells and in the production of Silicon on Insulator (SOI) wafers.

2. Background Information

Methods for exfoliation of thin layers of silicon have been developed which typically involve ion implantation of hydrogen and/or helium into a crystalline silicon substrate followed by annealing, under process conditions which facilitate substantially uniform shearing. For example, high implant doses, such as 7e16 atoms/$cm^2$ of hydrogen in the case of hydrogen implantation, are used. The implantation at high doses causes damage to the silicon crystal and with the post implantation annealing, the implanted layer creates internal pressure in the form of bubbles resulting in the fracture of the silicon crystal and exfoliation of the overlying silicon layer.

During implantation, damage to the silicon crystal is created in the form of lattice dislocations. Some damage at the end of range is required for the exfoliation process. However, in order to optimize performance in the resulting SOI or photovoltaic device, damage to the bulk silicon should be mitigated. Post implantation annealing is performed to reduce lattice dislocations. It is also known that implantation at higher temperatures reduces damage to the crystal during the implantation process. However, during implantation, the temperature of the silicon substrate is normally controlled to prevent premature exfoliation which may occur at temperatures of typically greater than 250° C.

Batch type ion implantation apparatus is known which allows for a batch of wafers to be processed simultaneously by mounting the wafers round the periphery of a process wheel mounted for rotation about an axis, so that the wafers on the wheel pass one after the other through a beam containing the ions to be implanted. The wafers are mounted on cooled wafer carriers. The wafer carriers provide wafer support surfaces canted inwards slightly, so that on rotation of the process or implant wheel, wafers are pressed by centrifugal force against the wafer support surfaces. Fences are located at edges of the wafer support surfaces which are outermost relative to the axis of rotation of the process wheel, to prevent wafers from sliding outwards on the wafer carriers. Such an apparatus thus enables a high current ion beam to be used which increases throughput whilst maintaining the temperature of the wafers within an acceptable range. Thus, there are known arrangements for cooling the wafers to an acceptable temperature range, but there remains a need to control the temperature of the silicon substrate during ion implantation to improve the process. There is also a need to avoid excessive temperature variation over the wafer area during implantation.

BRIEF SUMMARY OF THE INVENTION

An aspect of the invention provides implantation apparatus for implanting ions into planar substrate wafers, comprising an implant wheel mounted for rotation about a wheel axis; a plurality of wafer carriers distributed about a periphery of said implant wheel; a respective heat sink in each said wafer carrier for removing heat from a wafer on said carrier during an ion implantation process by said wafer thermal coupling with and said heat sink, each of said wafer carriers having a wafer support surface in a respective wafer support plane canted inwards towards the wheel axis; and at least one fence located at a radially outer edge of each of said carriers to prevent wafers on the carriers from sliding outwards on the carriers during rotation of said implant wheel, whereby the wafers are pressed by centrifugal force against said support surfaces, wherein each said fence has a respective abutment surface to engage an outer edge of a wafer on the wafer carrier, and wherein said abutment surface is movable transversely relative to said respective wafer support plane as the wafer is pressed by centrifugal force against said support surface. Said wafer support surfaces may comprise a layer of elastomeric material.

In an embodiment, said fence on each of said wafers comprises a fence body mounted on said wafer carrier to provide said transversely movable abutment surface, said fence body being mounted to neutralize the influence on said body of centrifugal force when the implant wheel is rotated. In an example, said fence body is cylindrical, mounted for rotation about an axis in a plane parallel to said wafer support plane.

The invention also provides a method of ion implantation using an implant wheel mounted for rotation about a wheel axis with a plurality of wafer carriers distributed about a periphery of said implant wheel and a respective heat sink in each said wafer carrier for removing heat from a wafer on said carrier, during an ion implantation process, by said wafer thermal coupling with said heat sink, in which said wafer carriers have wafer support surfaces in respective wafer support planes canted inwards towards the wheel axis; the method comprising the steps of mounting wafers to be implanted on the inwardly canted support surfaces of said wafer carriers; and rotating the implant wheel about the wheel axis while applying a centripetal force to an outside edge of each wafer to prevent outward movement of wafers on the support surfaces, wherein the centripetal force is applied without any force on the wafer transverse to the wafer support surface, so that centrifugal force acts to press the wafer against the support surface evenly over the area of the wafer. Where said heat sinks in the wafer carriers each have an elastomeric layer providing the respective wafer support surfaces, said centripetal force is applied to each wafer without impeding movement of the outer edge of the wafer transversely of the plane of the wafer.

Said ion implantation process and said ion implantation apparatus may be operative to deliver an average power to the wafer of at least 50 watts or at least 200 watts.

BRIEF DESCRIPTION OF THE DRAWINGS

Examples of the invention will be described below with reference to the accompanying drawings, in which;

FIG. 9 is a side view of a wafer carrier providing a further embodiment of the invention.

FIG. 10 is a front side view of the wafer carrier of FIG. 9.

FIG. 12 is an enlarged cross-sectional view, taken along lines Y-Y in FIG. 11, of the fence structure of the wafer carrier illustrated in FIGS. 9, 10 and 11.

DETAILED DESCRIPTION OF THE INVENTION

Figure 1:
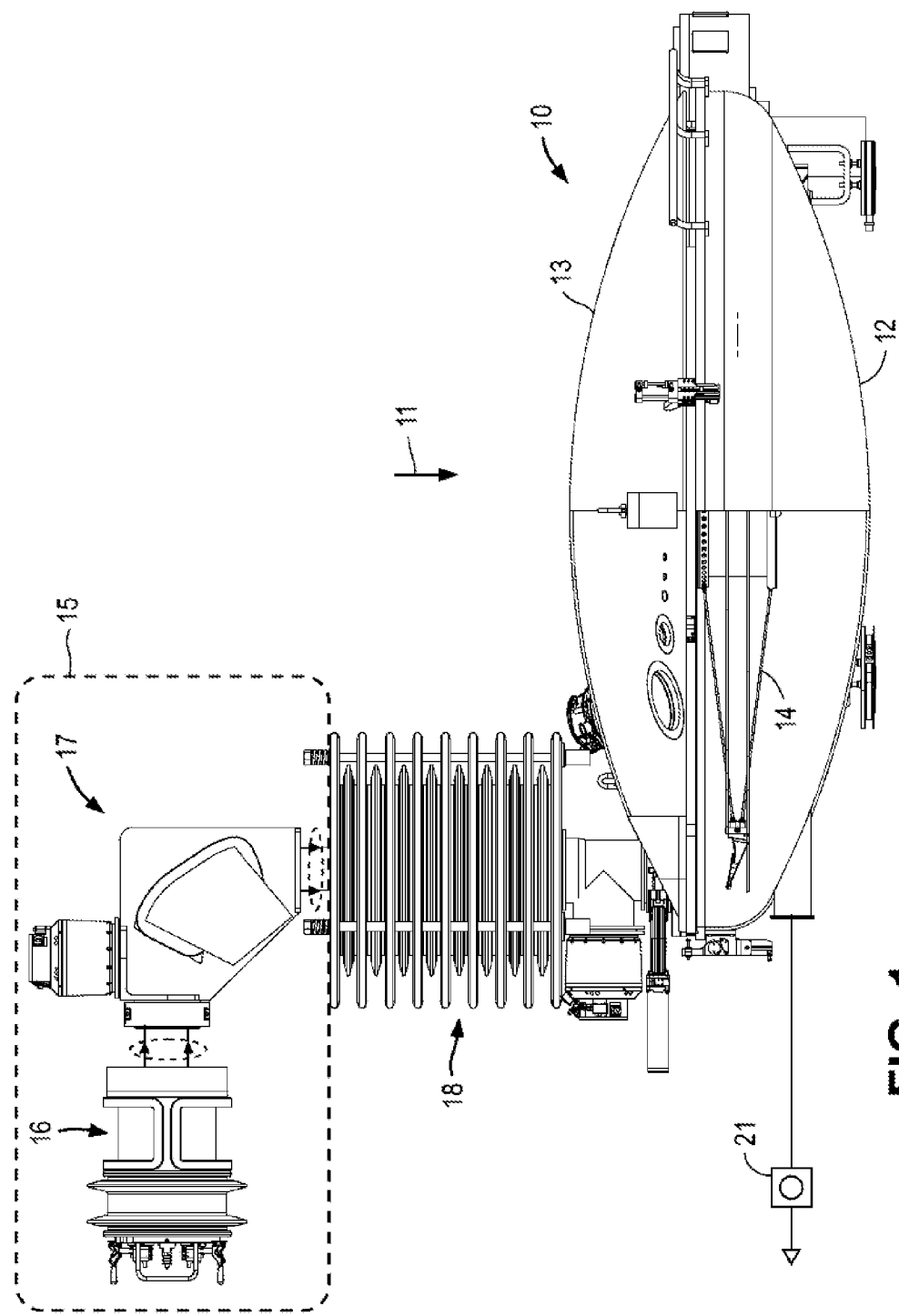
FIG. 1 is a schematic view in elevation and partially cut away, of an ion implanter embodying the present invention.

FIG. 1 is a schematic illustration of ion implantation apparatus which is an embodiment of the present invention. Ion implantation is conducted in a vacuum environment and the main operative features of the embodiment are contained within a vacuum chamber. In the illustrated embodiment in FIG. 1, the vacuum chamber is shown in three interconnected parts. The first part is a process chamber 10 which has a circular profile when viewed from above in FIG. 1 along the direction of arrow 11. The process chamber 10 comprising a part spherical lower wall section 12 and an opposed part spherical upper wall section 13, forming a disc shaped vacuum enclosure which is thickened at the center of the disc. This process chamber 10 contains a process wheel or implant wheel 14 extending in the plane of the disc chamber 10 for rotation about a vertical axis aligned substantially with the center of the disc. Wafer substrates for processing are carried in the process chamber 10 about the periphery of the implant wheel 14, as will be described and illustrated later in greater detail.

A second part of the vacuum chamber is contained in a high voltage enclosure 15 and is constituted by an ion source structure 16 and a mass selection magnet structure 17. A beam of ions desired for implantation (in one embodiment, H+ ions) is produced in the ion source structure 16 and directed into the magnet structure 17. The magnet structure 17 is effective to bend the ion beam, allowing unwanted ions in the beam to be filtered from the continuing beam which is directed towards the process chamber 10. Ion source and mass selection structures 16 and 17 are well known and will not be described in greater detail herein. For example, U.S. patent application Ser. No. 12/494,269 to Ryding assigned to the assignee of the present invention describes an ion source and mass selection structure and the disclosure of this US patent application is incorporated herein by reference in its entirety for all purposes A third part of the vacuum chamber is constituted by an accelerator tube 18 which interconnects the high voltage part of the vacuum chamber within the high voltage enclosure 15 and the process chamber 10. The accelerator tube 18 comprises an electrically insulating element to allow the ion source and mass selection structures 16 and 17 to be held at a very high voltage relative to the process chamber 10. Electrodes contained in the accelerator tube are electrostatically biased to accelerate the ion beam directed from the mass selection structure 17 to the required implant energy for delivery to the process chamber 10. All parts of the vacuum chamber are pumped down by one or more vacuum pumps, one of which is shown schematically in FIG. 1 at 21.

Figure 2:
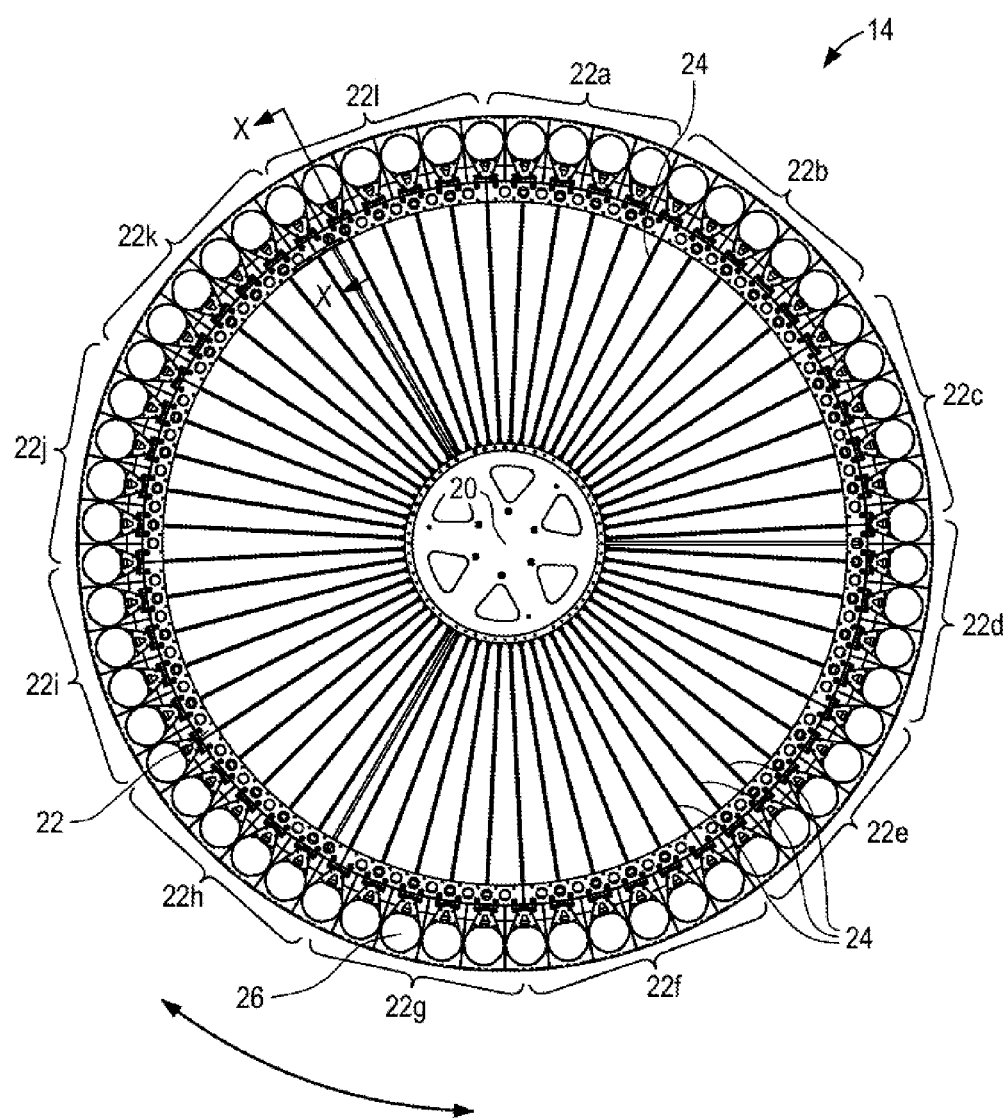
FIG. 2 is a plan view of the implant wheel of the ion implanter of FIG. 1.

Turning now to FIG. 2, a plan view of the implant wheel 14 is shown. The implant wheel comprises a hub 20 and a rim 22 connected to the hub 20 via a plurality of spokes 24. The rim 22 is formed as a plurality (twelve in this embodiment) of segments 22a, 22b . . . 22l each of which forms, in the embodiment of FIG. 2, a 30° arc of the rim.

Each segment of the rim 22 in turn carries a plurality of equidistantly spaced substrate supports or wafer carriers 26, extending radially outwardly from the rim segments. This plurality may be five, as in FIG. 2; so that the implant wheel 14 of FIG. 2 thus carries 60 wafer carriers 26 around the rim 22. Each of the wafer carriers 26 provides a wafer support surface which is shaped and sized to match or be similar to the substrate wafer to be processed. For example, if the substrate wafer to be processed is a 150 mm circular wafer, the support surfaces of the supports 26 are made of similar size and shape and the diameter of the implant wheel is such as to provide a peripheral circumference of at least 60×150 cm so that the 60 supports (and 60 wafers on the supports) are accommodated around the implant wheel periphery without overlapping. Instead of 150 mm circular support surfaces, other shapes and sizes may be provided to accommodate other wafer shapes and sizes, but in each case, the implant wheel is formed with a peripheral circumference of at least N*a where N is the number of wafer supports and a is the smallest width of the wafer substrates to be processed. If the wafers are circular, a is the diameter.

A characteristic of the embodiment is that there are at least 50 (60 in this example) wafer supports 26 on the implant wheel and the ion source and mass selection magnet structures 16 and 17 in combination with the accelerator tube 18 provide an ion beam directed at wafers on the carriers 26 of the implant wheel which has an energy of at least 200 keV and an ion current of at least 30 mA. Then the power delivered to wafers by the beam is at least 6 kW. By ensuring the implant wheel can accommodate at least 50 wafers at the same time, spinning the wheel during processing allows this beam power to be shared between the wafers on the wheel so that each wafer receives only as much power as can be dissipated or removed without overheating and damaging the wafer.

Referring again to FIG. 2, the spokes 24 may have a dual purpose. Firstly, they may extend between the hub 20 and the rim 22 under tension. By holding the spokes 24 under tension, the 12 segments 22a-22l of the rim 22 are drawn towards the hub 20 and compress together circumferentially. Thus the rim 22 is stiffened rotationally by the tension in the spokes 24. Note that, in the embodiment, the spokes 24 are equally spaced around both the hub 20 and rim 22, and, are aligned radially. If it is desired to increase the rotational stiffness of the process wheel 14, then stiffener plates may be employed. Alternatively, bracing bars may be provided extending non-radially between the hub 20 and the rim 22. A symmetrical arrangement of six such bars can be tensioned to provide torsional stiffness in both rotational directions. In another embodiment, torsional stiffness is provided by non-radial alignment of the spokes 24 to form an interlaced pattern in the fashion of a wire-spoked bicycle wheel.

The second possible purpose of the spokes is to facilitate the channeling of cooling fluid from outside of the disc shaped vacuum enclosure, via the hub 20, to the rim 22 by way of spokes 24 in embodiments in which the carriers 26 are arranged to be cooled. Cooling fluid is then channeled at the rim to each carrier 26 so as to provide cooling for a wafer mounted on the carrier 26, during implantation. In an embodiment, the spokes 24 are arranged so that a pair of spokes extend between the hub 20 and each carrier 26: one spoke of the pair carries cooling fluid between the hub and a carrier 26 in a first direction (e.g., hub to rim), and the other spoke of the pair carries cooling fluid between the hub 20 and the carrier 26 in the opposite direction (e.g., rim to hub).

Figure 3:
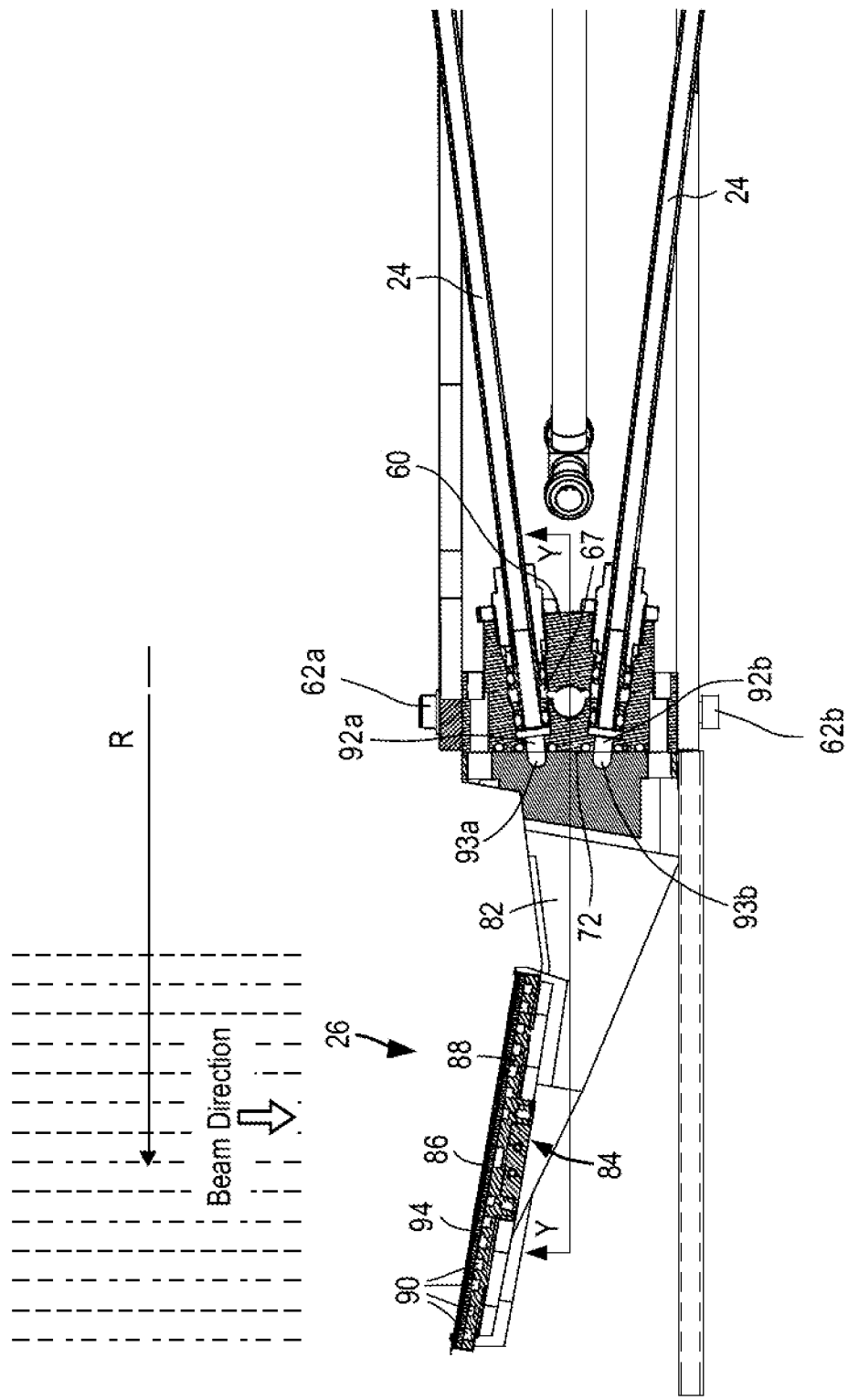
FIG. 3 is a view in elevation and in section of the rim of the implant wheel of FIG. 2 together with a wafer carrier mounted thereon.

Turning now to FIG. 3, a section through the implant wheel 14 along the line X-X of FIG. 2 is shown. This represents a close-up section through the rim 22 of the implant wheel 14 and a carrier 26. As shown in FIG. 3, the spokes 24 of the pair extend to the carrier 26 in substantially the same plane, with one spoke above the other. This allows cooled fluid to be channeled from outside the process chamber 10, via the hub 20, to the rim (through the upper spokes 24, for example) and from there to the carriers 26, where heat caused by ion implantation into wafers upon the carriers 26 is conducted into the cooling fluid. Then the heated cooling fluid circulates back to the rim 22 and is taken away via the lower spokes 24 (in this example), back to the hub 20 and then away from the process chamber 10 to be recycled or discarded.

The manner in which the carriers 26 are cooled and the manner in which the stationary cooling fluid supply and return lines (not shown in the Figures) are connected to the hub 20, which of course rotates in use, do not form a part of the present invention and thus are not described further herein. More details concerning an example implementation for cooling the carriers 26 is provided in the aforementioned U.S. patent application Ser. No. 12/494,269 to Ryding. Other known cooling techniques may instead be used.

The rim 22 is formed as segments 22a . . . 22l of an annulus, as is best seen in FIG. 2, and provides mechanical support for the spokes 24. Extending around the circumference of the rim 22 is a plurality of mounting blocks 60, shown in FIG. 3. Each mounting block 60 is affixed at an upper and lower surface to the rim 22. Each mounting block 60 is generally rectilinear with a major axis extending in the circumferential direction of the rim 22. Each mounting block 60 is, however, spaced circumferentially from adjacent mounting blocks: that is, the major axis of each block 60 extends over less than 360/N degrees of arc, where N is the number of substrate supports (60 in the example of FIG. 2). As seen in FIG. 3, each mounting block 60 is affixed to one of the segments 22a . . . 22l of the rim 22 using screws 62a, 62b. Alternatively, the mounting blocks 60 could be welded to the rim segments 22a . . . 22l.

A radially outwardly directed face of each mounting block 60 forms a carrier mounting face 72 to which a carrier arm 82, having a radially inwardly directed planar mounting face, registers and is secured by appropriate bolts (for example) to the mounting face 72 of the respective mounting block 60.

The end of the carrier arm 82, distal from the mounting block 60, carries a respective wafer carrier 26 for supporting a substrate wafer 86. The carrier 26 contains a heat sink for removing heat from the wafer 86 during an ion implantation process by thermal contact between the wafer and the heat sink. The carrier 26 further has a wafer lift structure mounted thereon which is operable during the ion implantation process while ions are being implanted to adjust the thermal contact between the wafer and the heat sink to control heat removal from the wafer. In an embodiment, the wafer lift structure is movable so that the relative position of the wafer on the carrier 26 can be adjusted between a spaced apart position and a thermal contact position. In an example arrangement as will be described in more detail below, the lift structure is operable to move between a first position, with the wafer supported spaced away from the heat sink, and a second position, with the wafer in contact with the heat sink, when the implant wheel is rotating. The lift structure may be arranged to be responsive to centrifugal force when the implant wheel is rotating to move between the first and second positions as the speed of rotation of the implant wheel is varied. An example carrier and wafer lift structure in accordance with an embodiment of the invention is more clearly shown in FIGS. 4, 5, 6a, 6b and will be described in more detail below.

Figure 4:
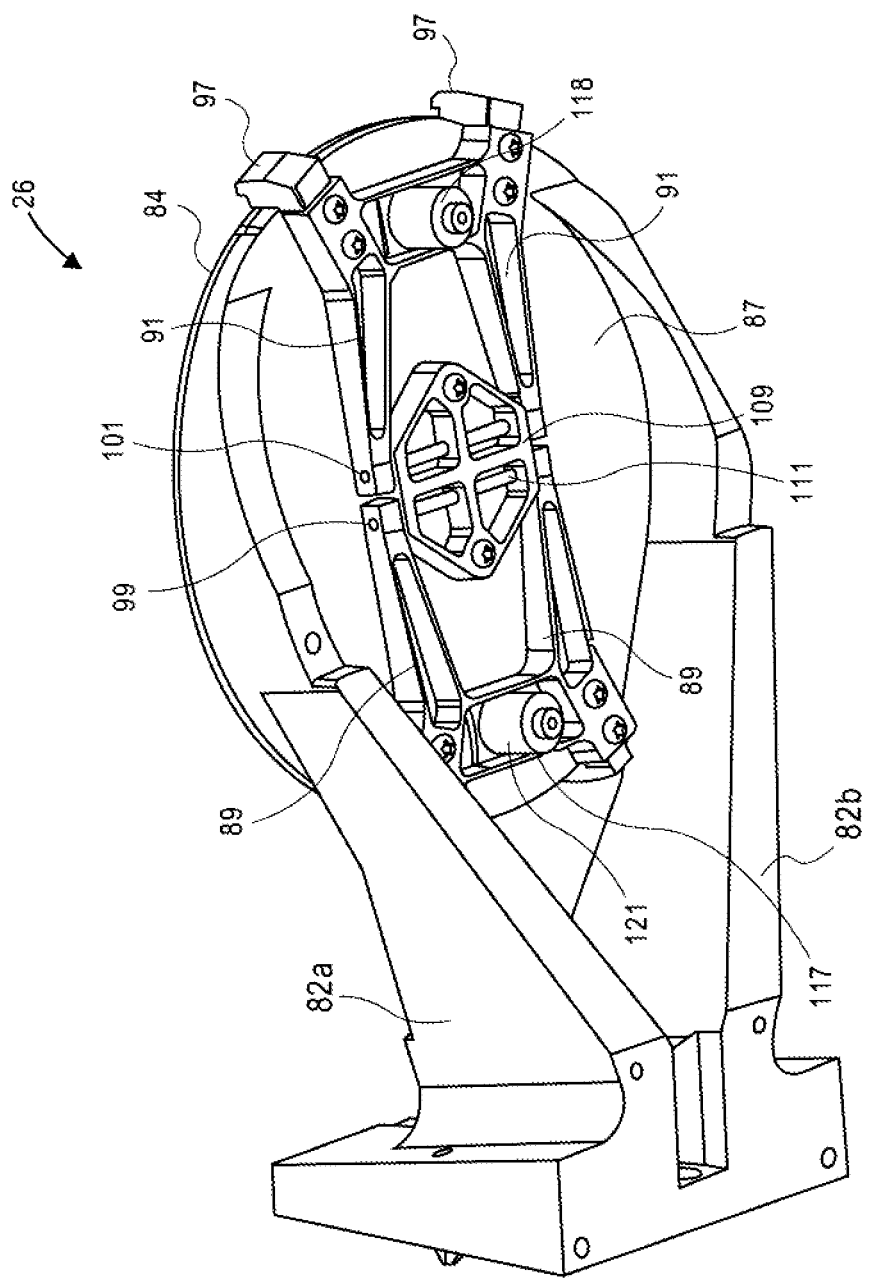
FIG. 4 is an enlarged back side view of a wafer carrier together with a wafer lift structure mounted thereon in accordance with an embodiment of the invention.
Figure 5:
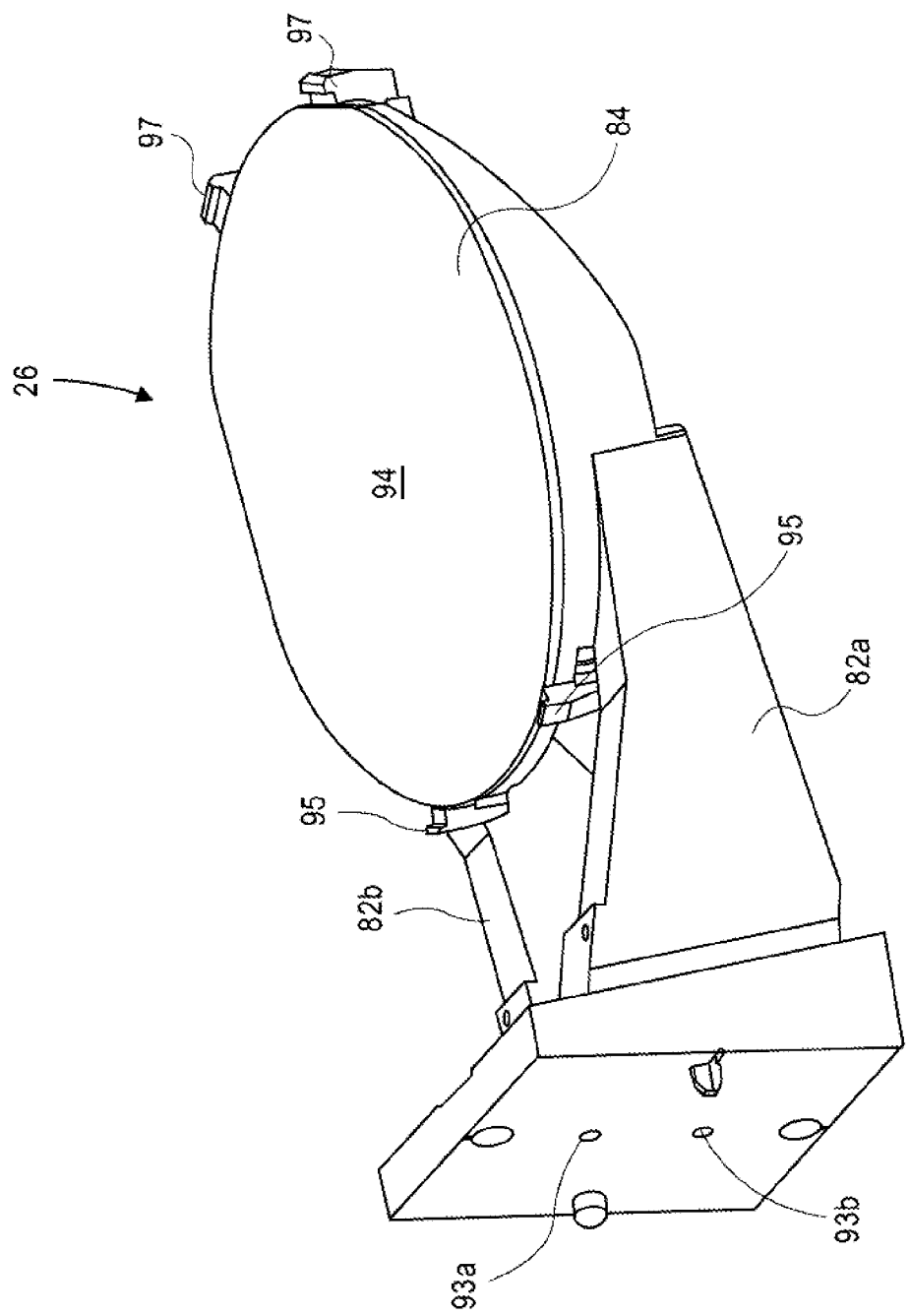
FIG. 5 is an enlarged front side view of the wafer carrier together with a wafer lift structure mounted thereon in accordance with the embodiment of the invention.

As shown in FIGS. 3, 4 and 5, this carrier 26 may comprise a pedestal 84 for supporting a wafer 86. An upper surface 94 of the pedestal 84 may be covered in an elastomeric thermally conductive material 88, such as Room Temperature Vulcanizing (RTV) silicone rubber. As best seen in FIG. 3, below the upper surface 94 of the pedestal 84 there are formed a plurality of cooling channels 90. These channels 90 communicate, via internal fluid passages (not shown) in the arm 82 of the substrate support 26, to the radially inwardly directed mounting face of the carrier 26. These cooling passages in the arm 82 register by means of openings 93a and 93b with respective passages 92a and 92b in the support mounting face 72 of the block 60. The passages 92a and 92b connect to the ends of the tubular spokes 24 so as to carry cooling fluids between the carrier 26 and the hub 20 as described above. The heat sink of each of the carriers 26 may therefore be provided by the conductive path provided by the thermally conductive material 88 formed on the pedestal 84 and, when used, also the cooling fluids carried to and from the carrier 26 via the cooling channels 90. It will however be appreciated that it is not intended to limit the invention to the particular heat sink arrangement shown in the Figures and alternative heat sink arrangements would be readily apparent to a person skilled in the art.

As further shown in FIGS. 4 and 5, the carrier arm 82 comprises two arm portions 82a and 82b. When the carrier arm 82 is secured to the mounting block 60, the arm portions 82a and 82b extend outwardly from the mounting block and are arranged so that the ends of the arm portions, distal to the mounting block 60, engage an underside face 87 of the pedestal 84 so as to support the pedestal 84. As shown in FIG. 4, each end of the two arm portions 82a, 82b engage the underside face 87 of the pedestal at opposing edges of the pedestal 84.

In an embodiment, the carrier arm 82 (and thus the arm portions 82a, 82b) is arranged to cant the carrier 26 at a predetermined cant angle inwards toward the vertical implant wheel axis (best shown in FIG. 3) so that, because the wheel axis is spaced from said wafers, when the implant wheel rotates about the vertical axis in a horizontal plane, a centrifugal force is exerted on the wafers and the centrifugal force or a component of the centrifugal force urges the wafer 86 onto the respective carrier 26 and as will be described in more detail below, towards the heat sink. In other words, as the implant wheel rotates, a centripetal force is exerted on the wafers 86 by the pedestals 84 because of the aforementioned cant angle. In an example, the wafers may be angled at approximately 80° to the vertical wheel axis (i.e. 10° to the plane of the implant wheel 14), so that the wheel axis is angled relative to a normal to the wafers by about 10°.

The wafer lift structure on each carrier 26 is responsive to centrifugal force generated on rotation of the implant wheel 14 to move between a first position with the wafer supported spaced apart or away from the heat sink in the pedestal 84 and a second position with the wafer in thermal contact with the heat sink in the pedestal 84. The wafer lift structure provides an urging force which is greater than the centrifugal force exerted on the wafer at rotation speeds up to and including a transition speed which urging force urges the wafer to the spaced apart position. The wafer lift structure is adapted to bring the wafer in thermal contact with the heat sink when the implant wheel is rotating at speeds in excess of a transition speed. In other words, by adjusting the rotational speed of the implant wheel, the wafer lift structure can adjust the relative position of the wafer with respect to the heat sink in the pedestal 84 and thereby adjust the thermal contact between the wafer and the heat sink.

Figure 6A:
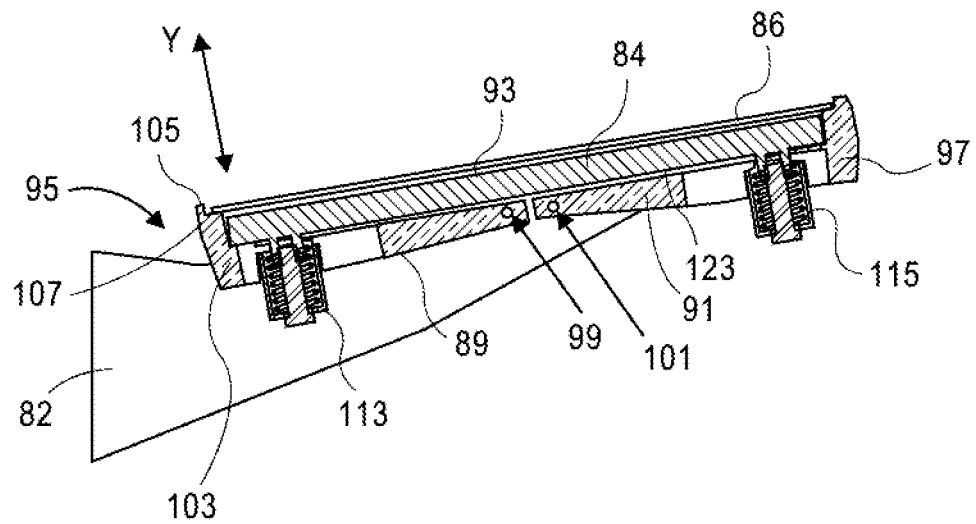
FIG. 6a is an enlarged schematic cross sectional view of the wafer carrier and the wafer lift structure of FIG. 4 with the wafer lift structure in a first position to position a wafer in a spaced apart position.
Figure 6B:
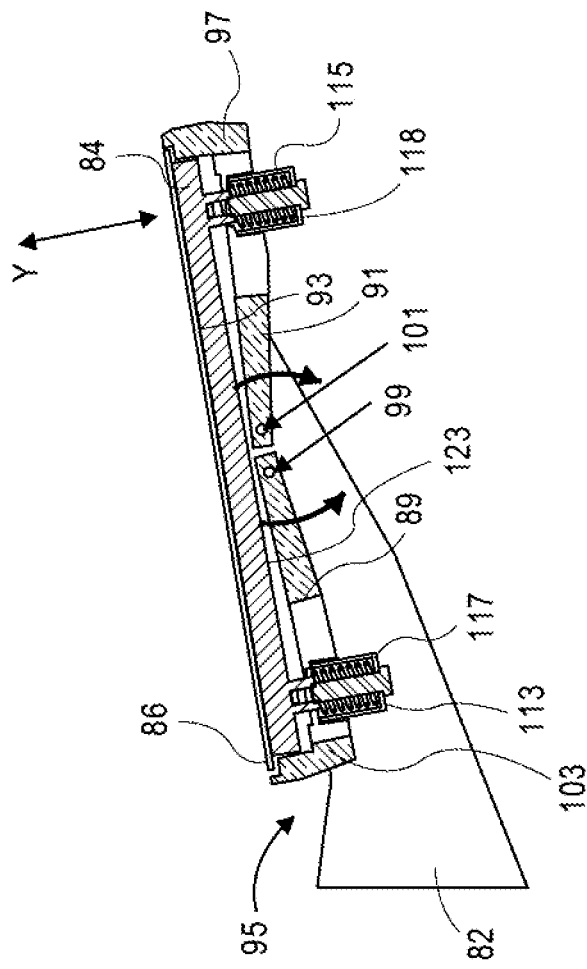
FIG. 6b is an enlarged schematic cross sectional view of the wafer carrier and the wafer lift structure of FIG. 4 with the wafer lift structure in a second position to position a wafer in a thermal contact position.

Referring to FIGS. 4 and 5, an example wafer lift structure comprises inner 89 and outer 91 fence arms mounted under the pedestal 84 of the carrier 26. The inner fence arm 89 provides an inner fence 95 at a radially inner edge of the carrier 26 relative to the wheel axis to support an inner edge of a wafer 86 (not shown in FIGS. 4 and 5 for simplicity) on the carrier 26. The outer fence arm 91 provides an outer fence 97 at a radially outer edge of the carrier 26 to support an outer edge of the wafer 86 on the carrier 26. As more clearly seen in FIGS. 6a and 6b, the inner 95 and outer 97 fences further support at the inner and outer edges an underside of the wafer 86 facing the heat sink (e.g. facing the upper surface 94 of the pedestal 84 on which is formed the thermally conductive material). The inner fence arm 89 is pivoted about a pivot point 99 and the outer fence arm 91 is pivoted about a pivot point 101. Pivoting of the fence arms 89 and 91 provides movement of the respective fences 95 and 97 along the direction Y as shown in FIGS. 6a and 6b, transverse to the plane of a wafer on the carrier 26. In FIG. 6a, the fences 95 and 97 are in the first position supporting the wafer spaced apart from the pedestal 84, and in FIG. 6b, the fences 95 and 97 are in the second position with the wafer in thermal contact with the pedestal 84.

In the embodiment shown in the Figures, the wafer lift structure has four fences: two inner fences 95 are provided at the inner edge of the carrier 26 and two outer fences 97 are provided at the outer edge of the carrier. Having four fences facilitates the correct positioning of the wafer on the carrier 26 before and during an ion implantation process but other arrangements of fences may alternatively be used (e.g. only two opposing fences).

The inner fence arm 89 extends from the pivot point 99 on the underside of the carrier 26 to an inner edge of the carrier, and around the inner edge of the carrier 26 to provide an inner fence wall 103. The inner fence wall 103 has an upper edge providing a support surface 107 to engage an underside of wafer 86 proximate an inner edge of the wafer. An inner fence ridge 105 extends upwards from said support surface 107 to locate the inner edge of wafer 86. As shown in FIG. 4, the inner fence arm 89 is pivotally coupled to the carrier 26 at the backside of the pedestal 84 on a shaft 111 supported on a fixing 109.

The outer fence arm 91 has a similar structure to that of the inner fence arm 89 described above. The outer fence arm extends to and around the outer edge of the carrier 26 so as to provide an outer fence wall having a corresponding upper edge providing a support surface and an outer fence ridge to support the outer edge of the wafer.

The wafer lift structure in accordance with an embodiment further comprises at least one spring for providing an urging force to urge the inner 89 and outer 91 fence arms so that the inner 95 and outer 97 fences move along the direction Y. For example, the at least one spring is arranged to urge the inner 95 and outer 97 fences upwards (in FIGS. 6a and 6b) relative to the pedestal 84 to a first position. In the first position, the fences 95 and 97 support the wafer 86 in a spaced apart position above the upper surface 94 of the pedestal 84. In other words, the wafer 86 is lifted off the upper surface 94 of the pedestal 84 by the movement of the fences 95 and 97 to the first position. In the example arrangement shown in the Figures, the wafer lift structure comprises an inner spring arrangement 117 which includes a spring 113 for controlling the movement of the inner fence arm 89 and an outer spring arrangement 118 which includes a spring 115 for controlling the movement of the outer fence arm 91.

Figure 7:
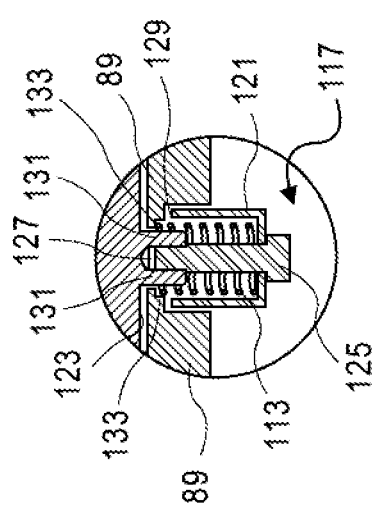
FIG. 7 is an enlarged schematic cross sectional view showing part of the lift structure of FIGS. 6a and 6b in greater detail.

FIG. 7 shows an enlarged view of spring arrangement 117. The outer spring arrangement 118 may have a similar arrangement.

The spring arrangement 117 comprises the spring 113 positioned within a housing 121 which is attached to an underside surface 123 of the pedestal 84 via a screw or plug 125. The screw or plug 125 extends through the housing 121 and the center of the spring 113 and securely mates with a seat 127 provided in the underside surface 123 of the pedestal 84. In the arrangement shown in FIG. 7, the seat 127 is arranged to extend from the underside surface 123 of the pedestal 84 and comprises a wall 131 that extends from the underside surface 123 of the pedestal to define an opening for receiving the screw 125. The spring 113 is attached to the housing 121 at an end distal from the pedestal 84 and the housing 121 has an open end 129 adjacent the underside surface 123 of the pedestal 84. The spring 113 extends from the open end 129, surrounds the wall 131 of the seat 127, and bears on a radially inwardly projecting flange 133 formed in the inner fence arm 89. In this embodiment, the spring 113 therefore provides an urging force tending to push the inner fence arm 89 upwards towards the underside surface 123 of the pedestal 84. This results in the inner fences 95 being moved to the first position. Similarly, spring 115 in spring arrangement 118 moves outer fence 97 to the first position. With the fences 95 and 97 in the first position, the wafer 86 is spaced apart from the heat sink of the carrier 26 as shown in FIG. 6a.

When the fences 95 and 97 are in the first position as shown in FIG. 6a, the wafer 86 is spaced apart from the heat sink. In this spaced apart position, wafer 86 can be loaded and unloaded from the carrier 26 and thus, the spaced apart position may represent the loading and unloading position.

Each of the fence arms 89 and 91 is arranged so that the center of mass of the respective fence arm is positioned with respect to its pivot point so that, when the implant wheel rotates, each fence arm is encouraged by centrifugal force to pivot against the urging of springs 113 and 115, so as to move the wafer onto the heat sink as shown in FIG. 6b. However, due to the urging force provided by the springs, the moving of the wafer into contact with the heat sink only occurs when the centrifugal force on the fence arms and the wafer exceeds the urging force provided by the springs, which is designed to occur when the rotational speed exceeds the aforementioned transition speed.

It is clear that the transition speed is determined by the choice of spring force, the mass of the fence arms and the location of the pivot point. The dimensions of the fence arms and spring can be determined readily by analysis.

It will be appreciated that spring arrangements other than that described in detail above may be used. The arrangements described above use springs in compression, and alternative arrangements can be devised readily using springs in extension.

Figure 8:
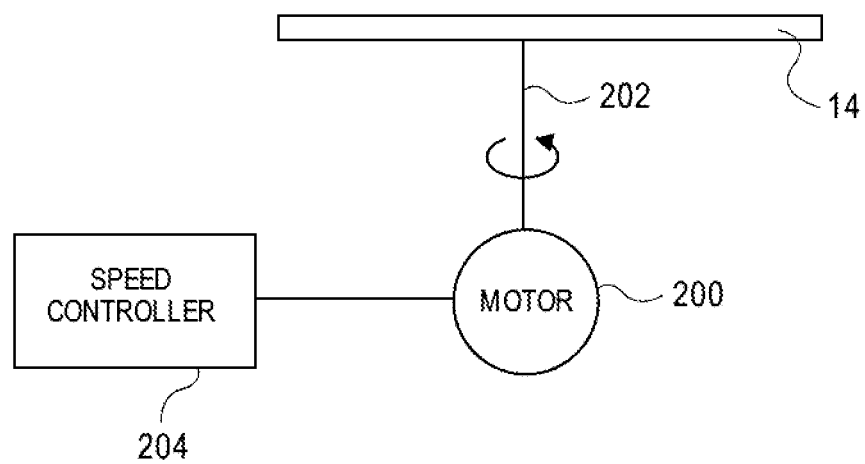
FIG. 8 is a block schematic diagram showing a drive motor and speed controller for controlling the rotation of the implant wheel of FIG. 2 in accordance with an embodiment of the invention.

FIG. 8 illustrates schematically an arrangement by way of example by which the speed of rotation of the implant wheel can be adjusted so as to adjust the relative position of the wafer with respect to the heat sink during an ion implantation process. Although not shown in FIG. 1, the ion implantation apparatus comprises a drive motor 200 coupled to the implant wheel 14 via a drive shaft 202 for rotating the implant wheel 14. A speed controller 204 is coupled to the drive motor 200 and is arranged to control the drive motor 200 to rotate the implant wheel while implanting ions into the wafers on the carriers 26. During ion implantation into the wafers on the carriers 26, with the ion beam directed onto the periphery of the implant wheel 14, the wheel should be rotated at speeds sufficient to spread the power of the beam among all the wafers on the carriers 26, and to limit localized differential heating of each wafer as the beam sweeps over the wafer. For beam powers up to about 12 kW, a minimum rotational speed of the implant wheel of about 20 r.p.m is sufficient for a wheel carrying 60+ wafers of 150 mm in diameter. Higher beam powers may require a higher minimum rotation speed. The speed controller 204 is arranged to vary the rotation speed so that during an ion implantation process, the rotation speed of the implant wheel is at least one rotation speed greater than said minimum rotation speed and up to the transition speed for a first period of time and the rotation speed is at least one rotation speed greater than the said transition speed for a second period of time. In an example, the transition speed may be about 80 rpm.

During the ion implantation process, the temperature of a wafer varies within the wafer both across the wafer in the major dimension of the wafer and through the wafer in the minor dimension of the wafer. Temperature variations across a wafer 86 can be due to varying geometry between the cooling channels 90 in the pedestal 84 which supports the wafer 86 and to variations in contact force between the wafer 86 and the thermal conductive material 88 on the upper surface 94 of the pedestal 84 which may be due to variations in flatness of the wafer 86 and pedestal 84. Temperature variations through the wafer can be due to the period of time over which the ion beam is applied to the surface of the wafer and the time the wafer takes to conduct the heat away. The latter temperature variations are a function of the diameter of the implant wheel, ion beam power and rotation speed of the implant wheel.

By varying the rotation speed of the implant wheel during an ion implantation process, the relative position of the wafer 86 with respect to the heat sink in the carrier 26 can be adjusted so that at rotation speeds up to and including the transition speed, the wafer can be lifted completely off the upper surface 94 of the pedestal allowing thermal isolation of the wafer. The process takes place in a vacuum so that radiation is then the only heat loss mechanism. This allows the wafers to heat up during implantation resulting in much higher temperatures which can reduce the formation of lattice dislocations during implant. The higher temperatures that can be achieved are determined by the power of the ion beam applied to the wafer and the radiation losses from the wafer. After a critical implant dose and a predetermined high temperature is achieved, under the control of the speed controller 204, the speed of rotation of the implant wheel is increased to a speed in excess of the transition speed so that the wafer is moved into thermal contact with the heat sink in the pedestal 84 for the remaining implant dose. With the wafer in contact with the heat sink, the temperature of the wafer can be lowered which facilitates the prevention of premature exfoliation as the implant dose approaches the required dose for exfoliation. The temperature of the wafer can be lowered by conductive cooling through the thermally conductive material 88 on the upper surface 94 of the pedestal 84 and the cooling channels 90 in the pedestal 84. It may be possible to vary the amount of conductive cooling, when the wafer is in contact with the heat sink, by adjusting the rotation speed of the implant wheel under the control of the speed controller 204. This adjusts the centrifugal force exerted on the wafer which is pressing the wafer against the upper surface 94 of the pedestal 84 and can control the quality of thermal contact.

Different wafer lift structures can be contemplated. For example, each fence arm may have a center of mass located relative to the pivot point of the fence arm such that, when the implant wheel is at rest or is rotating at rotational speeds less than the transition speed, the line of action of the center mass due to gravity and centrifugal force acts relative to the pivot point so that the fence arm pivots to move the fence to the first position, and when the rotational speed of the implant wheel exceeds the transition speed, the line of action acts so that the fence arm pivots to move the fence to the second position.

Alternative wafer lift structures can be envisaged which may not require the speed of rotation to be varied in order to change the relative position of the wafer with respect to the heat sink in the carrier. For example, the wafer lift structure may comprise one or more actuators which can be operated to change the position of the wafer with respect to the heat sink at the appropriate time during implantation.

In summary, a wafer lift structure in accordance with the invention can adjust the thermal contact between a wafer and a heat sink in a carrier so that the temperature of the wafer during an ion implantation process can be controlled. An embodiment of the invention is arranged so that the position of the wafer relative to the heat sink can be adjusted by adjusting the rotation speed of the implant wheel. Thus, the present invention facilitates the control of bulk wafer temperature.

An embodiment of the invention uses a wafer lift structure that moves the wafer to a spaced apart position in which the wafer is spaced apart from the carrier. In this spaced apart position the wafer can be loaded and unloaded from the carrier. Thus, the same lift mechanism can be used for loading and unloading wafers and also for facilitating control of the wafer temperature.

Pin mechanisms for lifting a wafer during loading and unloading are known, however, these known pin mechanisms are not designed to lift the wafers during an ion implantation process while the implant wheel is rotating.

A further embodiment of the invention is shown in FIGS. 9 to 12, which illustrate a wafer carrier 300 replacing the wafer carrier 26 of FIGS. 3, 4, 5, 6A and 6B. As such, it can be seen that wafer carriers 300 will form parts of ion implantation apparatus comprising the implant wheel 14 which is mounted for rotation about a vertical wheel axis. The wafer carriers 300 are distributed about a periphery of this implant wheel 14 and each wafer carrier 300 has a respective heat sink 301 (in FIG. 9) which is effective to remove heat from a wafer 302 mounted on the wafer carrier 300. To provide effective heat removal during ion implantation, the wafer 302 is in good thermal contact with the heat sink 301. This may be via direct contact between the wafer 302 and the heat sink 301 or through layers of material that support good thermal contact. The wafer carrier 300 has a wafer support surface 303 on the heat sink 301. The wafer support surface 303 is in a wafer support plane which is, in one embodiment, canted inwards towards the wheel axis, which would be parallel to a vertical line in the orientation of the wafer carrier 300 shown in FIG. 9. In another embodiment, the wafer support plane in not canted inwards.

In this embodiment, the wafer support surface 303 is formed by a layer of elastomeric material on a surface of the heat sink 301. The elastomeric material may be a thermally conductive material such as RTV silicone rubber. Each of the wafer carriers 300 includes a carrier arm 304 which has an inwardly directed planar mounting face for connecting to the respective mounting blocks 60 (FIG. 3) of the implant wheel.

Figure 11:
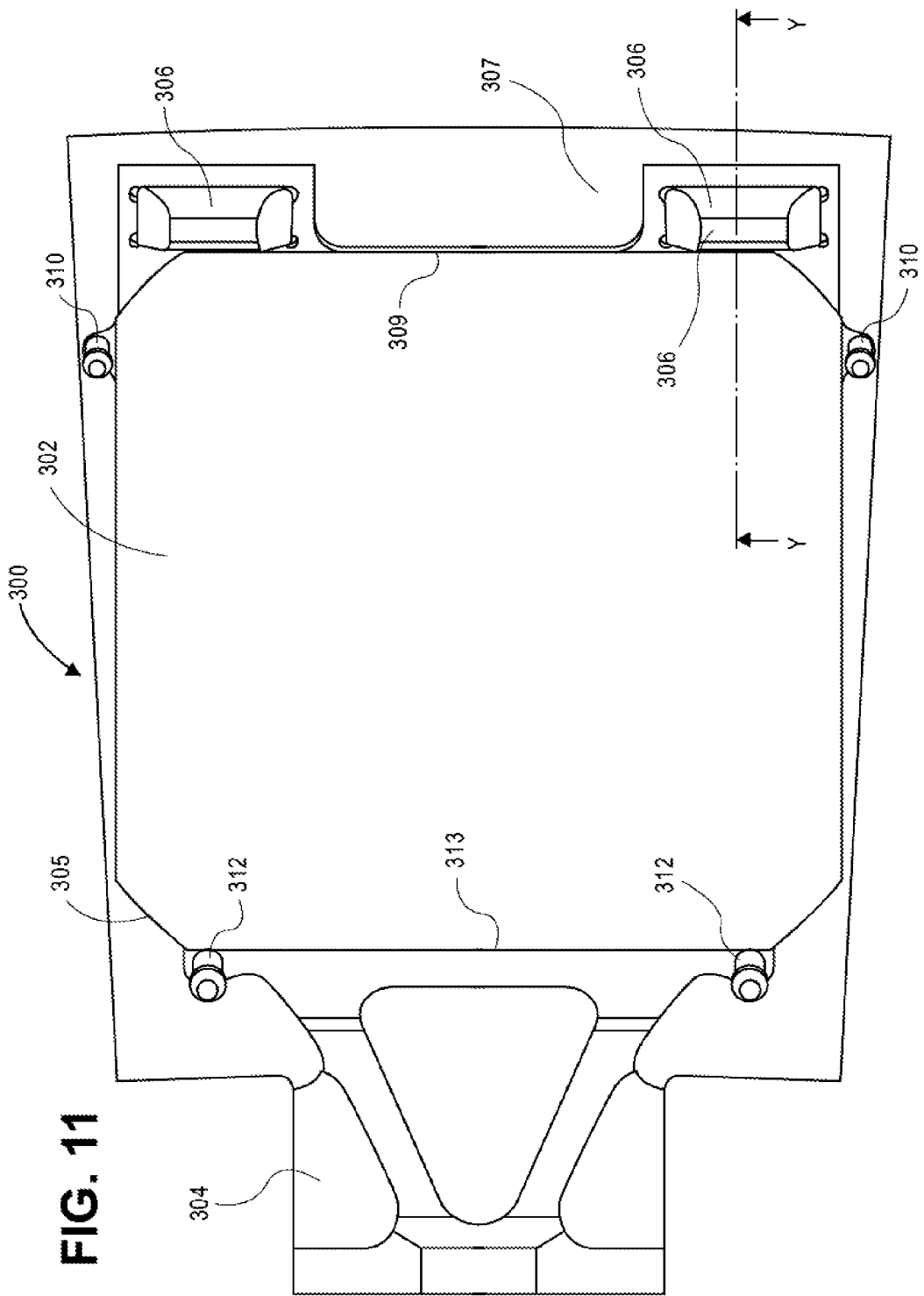
FIG. 11 is a front view of the wafer carrier of FIGS. 9 and 10.

As best seen in FIGS. 10 and 11, the wafer carriers 300 are adapted in this embodiment to carry wafers 302 which have a generally rectangular, typically square, shape. The square shaped wafers 302 are formed with cut-off corners providing corner edges 305 in the shape of arcs of a common circle.

The wafer carrier 300 includes a pair of fence structures 306, each mounted at a radially outer edge 307 of the carrier 300. The fence structures 306 are mounted on the carrier on opposite sides of a radial line through the axis of the implant wheel, which bisects the wafer 302 on the carrier. Each of the fence structures 306 provides an abutment surface 308 (see FIG. 9) which engages an outer edge 309 of the wafer 302, thereby applying the necessary centripetal force on the wafer 302, to prevent the wafer from sliding outwards on the support surface 303 (again, shown in FIG. 9) of the carrier 300 under the influence of centrifugal force during rotation of the implant wheel.

The carrier 300 also has a pair of lateral alignment pins 310 mounted on the carrier 300 to be just outside lateral edges 311 of the wafer 302, in order to ensure good lateral positioning of the wafer on the carrier. Two radial alignment pins 312 are located just inside an inner edge 313 of the wafer 302, in order to provide good alignment of the wafer in the radial direction relative to the implant wheel axis, particularly when the wafer 302 is first being positioned on the wafer carrier.

FIG. 12 is a detailed view in cross-section of one of the fence structures 306. Each fence structure comprises a fence body in the form of a right circular cylinder 315, mounted for rotation on a shaft 316, between mounting flanges, of which only one, 317, is visible in the cross-sectional view of FIG. 12. The mounting flanges 317 are formed on a mounting block 318, which is secured in an edge piece 319 at the outer edge 307 of the carrier 302.

In this embodiment, the cylindrical body, or roller, 315 is mounted on a shaft 316, to be freely rotatable about a shaft axis which is essentially in the same plane as wafer 302 on the carrier. It can be seen, therefore, that the axis of the shaft 316 is in a plane closely parallel to the plane of the wafer support surface 303 of the carrier.

The shaft 316 is also substantially aligned with the outer edge 309 of the wafer 302, so that the cylindrical surface of the roller 315 contacts the outer edge 309 of the wafer 302 over an extended contact line.

Importantly, with this arrangement for the fence structure 306, the cylindrical surface of the roller 315 provides an abutment surface for the edge 309 of the wafer, which abutment surface is movable transversely relative to the plane of the wafer support surface 303.

As mentioned previously, the wafer support surface 303 is formed by a layer of thermally conductive elastomer. During the implant process, the implant wheel may be rotated at high speed. Because of the angle at which the wafer 302 is canted inwards on the wafer support surface 303 by the wafer carrier 300, centrifugal forces acting on the wafer 302 press the wafer down against the wafer support surface 303. This action is important to ensure excellent thermal contact between the wafer 302 and the wafer support surface 303, which provides a heat sink for removing excess heat from the wafer 302 during the implant process. The elastomeric layer forming the support surface 303 can absorb a small amount of movement of the wafer under the influence of the centrifugal force, and the contact pressure between the wafer 302 and the elastomic layer will have an influence on the efficiency or thermal transfer from the wafer 302 into the underlying heat sink 301.

If the abutment surface of the fence retaining the outer edge 309 of the wafer from flying outwards under centrifugal force, is rigid, then this contact between the outer edge 309 and the fence can somewhat restrict the outer edge regions of the wafer 302 from pressing down against the elastomeric surface 303 of the wafer carrier. As a result, the efficiency of thermal conduction into the heat sink 301 from the wafer 302 can be reduced over the outer regions of the wafer near the retaining fences, where the wafer is being prevented by the fences from pressing to the same extent as elsewhere over the wafer against the elastomeric support surface 303.

Because the cylindrical surface of the rollers 315 are freely movable with the outer edges 309 of the wafer 302, there is no tendency for the fence structure 306 to significantly restrict the way in which the wafer 302 presses against the elastomeric surface 303. This improves uniformity of heat transfer from the wafer over the full surface area of the wafer, providing improved temperature uniformity over the wafer during processing. Temperature uniformity is important to prevent premature exfoliation over regions of excessive temperature during implantation, and to allow the implant process to be carried out at a high power to maximize productivity without risk of local excessive heating of the wafer.

By locating the roller 315 with its shaft axis 316 aligned with the plane of the wafer 302 on the wafer carrier, the roller 315 will apply minimal lateral force to the wafer 302, transverse to the wafer plane, which lateral force could influence the efficiency of thermal conduction into the heat sink 301.

Importantly also, the roller 315 is made to be balanced, so that its center of mass is on the axis of rotation. In this way, the centrifugal force on the roller 315 produces no torque on the roller 315, so that there is no corresponding transverse force produced by the roller 315 on the outer edge of the wafer 302. Thus, the roller 315 provides a fence body which is mounted to neutralize the influence on the body of centrifugal force when the implant wheel is rotated.

Each fence structure 306 includes a respective beam strike shield 320, which encloses the roller 315 and its mounting flanges 317, leaving an inwardly facing window 321 through which an inner edge of the roller 315 projects a short distance, to allow the wafer edge 309 to engage the cylindrical surface of the roller 315 without interfering with the housing 320. The projection of the roller 315 from the housing 320 is best illustrated in FIG. 9.

The beam strike shield 320 screens a major part of the fence body constituted by the cylinder 315 to prevent excessive beam strike on the cylinder 315, which could cause excessive heating of the cylinder. The beam strike shield 320 is made sufficiently substantial to absorb and conduct away to the heat sink portion 301 of the wafer carrier 300 the heat energy produced by beam strike on the shield 320.

In general, the beam strike shield 320 may cover a major portion of the fence body, constituted in this example by the roller 315. The fence may also cover a mobile mount structure for mounting the fence body on the wafer carrier. This mobile mount structure enables the fence body to move and provide the transversely movable abutment surface. In the present embodiment, this mobile mount structure is constituted by the rotary shaft 316.

Other fence structures providing a movable abutment surface, which minimize the transverse loading on the wafer edge engaging the fence, can be contemplated. The fence structure should provide an abutment surface which resists radially outward movement relative to the wafer carrier and is freely movable in a direction transverse to the wafer plane and wafer support surface, when engaging the edge of the wafer on the wafer carrier. The abutment surface may be mounted on a body which is designed and mounted to be minimally influenced by centrifugal force, so as to apply a minimal transverse force on the wafer edge during processing. In general, the fence structure enables centripetal force to be applied the outside edge of the wafer to prevent outward movement of the wafer on the support surface, without applying any force on the wafer in a direction transverse to the wafer support surface. Then the centrifugal force on the wafer can act to press the wafer against the support surface evenly over the surface of the wafer.

A variety of examples and embodiments have been provided for clarity and completeness. Other embodiments of the invention will be apparent to one of ordinary skill in the art when informed by the present specification. Detailed methods of and systems for implantation have been described herein, but any other methods and systems can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. Ion implantation apparatus for implanting ions into planar substrate wafers, comprising:
   an implant wheel mounted for rotation about a wheel axis; a plurality of wafer carriers distributed about a periphery of said implant wheel; a respective heat sink in each said wafer carrier for removing heat from a wafer on said carrier during an ion implantation process by said wafer being thermally coupled with said heat sink;
   each of said wafer carriers having a wafer support surface in a respective wafer support plane canted inwards towards said wheel axis; and
   at least one fence located at a radially outer edge of each of said carriers to prevent wafers on said carriers from sliding outwards on said carriers during rotation of said implant wheel, whereby said wafers are pressed by centrifugal force against said support surfaces,
   wherein each said fence has a respective abutment surface to engage an outer edge of a wafer on said wafer carrier,
   wherein said abutment surface is movable transversely relative to said respective wafer support plane as said wafer is pressed by centrifugal force against said support surface,
   wherein said fence on each of said wafer carriers comprises a fence body mounted on said wafer carrier to provide said transversely movable abutment surface, said fence body being mounted to neutralize influence on said body of centrifugal force when said implant wheel is rotated, and
   wherein said fence body is cylindrical, mounted for rotation about an axis in a plane parallel to said wafer support plane.

2. A method of ion implantation using an implant wheel mounted for rotation about a wheel axis with a plurality of wafer carriers distributed about a periphery of said implant wheel and a respective heat sink in each said wafer carrier for removing heat from a wafer having a surface area on said carrier, during an ion implantation process, said wafer being thermally coupled with said heat sink, in which said wafer carriers have wafer support surfaces in respective wafer support planes canted inwards towards said wheel axis, the method comprising the steps of:
   mounting wafers to be implanted on said inwardly canted support surfaces of said wafer carriers; and
   rotating said implant wheel about said wheel axis while applying a centripetal force to an outside edge of each wafer to prevent outward movement of wafers on said support surfaces,
   wherein said centripetal force is applied without any force on said wafer in a direction transverse to said wafer support surface, so that centrifugal force acts to press said wafer against said support surface evenly over said surface area of said wafer, wherein said centripetal force is applied by the steps of:
   providing an abutment surface to engage an outside edge of said wafer; and
   mounting said abutment surface on said wafer carrier to resist outward movement relative to said wafer carrier and to be freely moveable in said direction transverse to said wafer support surface, wherein said abutment surface is provided on a fence body,
   wherein said fence body is cylindrical, and wherein said mounting step includes:
   mounting said fence body to neutralize said influence of centrifugal force on said body when said implant wheel is rotating, and
   mounting said fence body for rotation about an axis in a plane parallel to said wafer support plane.

3. Ion implantation apparatus for implanting ions into planar substrate wafers, comprising:
   an implant wheel mounted for rotation about a wheel axis; a plurality of wafer carriers distributed about a periphery of said implant wheel; a respective heat sink in each said wafer carrier for removing heat from a wafer on said carrier during an ion implantation process by said wafer being thermally coupled with said heat sink;
   each of said wafer carriers having a wafer support surface in a respective wafer support plane canted inwards towards said wheel axis; and
   at least one fence located at a radially outer edge of each of said carriers to prevent wafers on said carriers from sliding outwards on said carriers during rotation of said implant wheel, whereby said wafers are pressed by centrifugal force against said support surfaces,
   wherein each said fence has a respective abutment surface to engage an outer edge of a wafer on said wafer carrier,
   wherein said abutment surface is movable transversely relative to said respective wafer support plane as said wafer is pressed by centrifugal force against said support surface,
   wherein said fence comprises: a fence body and a mobile mount structure mounting said fence body on said wafer carrier to enable said fence body to move and provide said transversely movable abutment surface, and
   wherein each of said wafer carriers includes a beam strike shield mounted on said wafer carrier to cover a major portion of said fence body and said mobile mount structure to intercept beam ions during implanting.

4. Ion implantation apparatus as claimed in claim 3, wherein said beam strike shield is formed as a housing enclosing said major portion of said fence body and said mobile mount structure, and wherein said housing has a radially inwardly facing window, and said fence body projects through said window.

5. A method of ion implantation using an implant wheel mounted for rotation about a wheel axis with a plurality of wafer carriers distributed about a periphery of said implant wheel and a respective heat sink in each said wafer carrier for removing heat from a wafer having a surface area on said carrier, during an ion implantation process, said wafer being thermally coupled with said heat sink, in which said wafer carriers have wafer support surfaces in respective wafer support planes canted inwards towards said wheel axis, the method comprising the steps of:

mounting wafers to be implanted on said inwardly canted support surfaces of said wafer carriers, rotating said implant wheel about said wheel axis while applying a centripetal force to an outside edge of each wafer to prevent outward movement of wafers on said support surfaces, wherein said centripetal force is applied without any force on said wafer in a direction transverse to said wafer support surface, so that centrifugal force acts to press said wafer against said support surface evenly over said surface area of said wafer, wherein said centripetal force is applied by the steps of:

providing an abutment surface to engage an outside edge of said wafer; and mounting said abutment surface on said wafer carrier to resist outward movement relative to said wafer carrier and to be freely moveable in said direction transverse to said wafer support surface, wherein said abutment surface is provided on a fence body; and wherein said mounting step includes:

mounting said fence body to neutralize said influence of centrifugal force on said body when said implant wheel is rotating; and screening a major portion of said fence body from beam strike during implantation.

* * * * *